United States Patent
J et al.

(10) Patent No.: US 12,026,028 B2
(45) Date of Patent: Jul. 2, 2024

(54) PREVENTING REVERSE-CURRENT FLOW WHEN AN INTEGRATED CIRCUIT OPERATES USING POWER SUPPLIES OF DIFFERENT MAGNITUDES

(71) Applicant: Shaoxing Yuanfang Semiconductor Co., Ltd., Shaoxing (CN)

(72) Inventors: Raja Prabhu J, Bangalore (IN); Rakesh Kumar Gupta, Bangalore (IN); Shuvadeep Mitra, Bangalore (IN); Anurag Pulincherry, Bangalore (IN); Ankit Seedher, Bangalore (IN)

(73) Assignee: Shaoxing Yuanfang Semiconductor Co., Ltd., Zhejiang (CN)

( * ) Notice: Subject to any disclaimer, the term of this patent is extended or adjusted under 35 U.S.C. 154(b) by 220 days.

(21) Appl. No.: 17/813,044

(22) Filed: Jul. 18, 2022

(65) Prior Publication Data
US 2023/0128789 A1    Apr. 27, 2023

(30) Foreign Application Priority Data
Oct. 22, 2021    (IN) .............................. 202141048243

(51) Int. Cl.
*G06F 1/26*    (2006.01)
*G06F 1/24*    (2006.01)
(Continued)

(52) U.S. Cl.
CPC ................ *G06F 1/263* (2013.01); *G06F 1/24* (2013.01); *G06F 13/4068* (2013.01); *H02J 1/10* (2013.01); *G06F 1/266* (2013.01); *H03L 7/085* (2013.01)

(58) Field of Classification Search
CPC ... G06F 1/24; G06F 1/26; G06F 1/263; G06F 1/266; G06F 1/28; G06F 13/4068;
(Continued)

(56) References Cited

U.S. PATENT DOCUMENTS 5,917,348 A * 6/1999 Chow ............ H03K 19/018592
                                                    327/437
5,963,055 A * 10/1999 Tanaka ............. H03K 19/00315
                                                    326/86
(Continued)

FOREIGN PATENT DOCUMENTS

EP         1965425 A1    9/2008
WO    WO2016122836 A1    8/2016

OTHER PUBLICATIONS

"Overcurrent protection function and reverse current prevention function of the load switch IC", Mar. 26, 2021, 12 pages.
(Continued)

*Primary Examiner* — Thomas J. Cleary
(74) *Attorney, Agent, or Firm* — IPHORIZONS PLLC; Narendra Reddy Thappeta

(57) ABSTRACT

An integrated circuit (IC) includes input/output (I/O) ports, each operating using one of a pair of unequal power supplies during normal operation of the IC. A lower supply of the pair of unequal power supplies is required to be used as the power supply for the I/O port when a first input signal to the IC is received from an external source on a first I/O port of the I/O ports. The voltage range of the logic excursions of the first input signal is greater than the range from a magnitude of the lower supply to a constant reference potential. A regulation loop derives a derived lower supply having a magnitude equaling that of the lower supply from the higher supply of the pair of unequal power supplies, and applies the derived lower supply on a power supply node of the first I/O port.

20 Claims, 5 Drawing Sheets

(51) Int. Cl.
*G06F 13/40* (2006.01)
*H02J 1/10* (2006.01)
*H03L 7/085* (2006.01)

(58) Field of Classification Search
CPC ......... G06F 13/4072; H02J 1/082; H02J 1/10; H02J 1/108; H02J 2310/16; H03L 7/085
See application file for complete search history.

(56) References Cited

U.S. PATENT DOCUMENTS

| | | |
|---|---|---|
| 5,966,044 A | 10/1999 | Naka |
| 6,157,070 A | 12/2000 | Lin et al. |
| 7,705,657 B2 | 4/2010 | Ueda |
| 9,438,032 B2 | 9/2016 | Iwamizu |
| 11,157,029 B1* | 10/2021 | Liu .................. G05F 1/575 |
| 2007/0114849 A1* | 5/2007 | Falik .................. H02J 7/34 |
| | | 307/64 |
| 2019/0272013 A1* | 9/2019 | Nagatomi ............... G06F 1/263 |

OTHER PUBLICATIONS

Hao-Ping Hong et al., "A Reverse-Voltage Protection Circuit for MOSFET Power Switches", IEEE Journal of Solid-State Circuits, Jan. 2001, pp. 152-155, vol. 36, No. 1.
Arthur Huang et al., "Reverse Current Blocking", 11 Ways to Protect Your Power Path, Texas Instruments, 2019, 62 pages.

* cited by examiner

| Chip Variant | VDD1 | VDD2 | VDDIO |
|---|---|---|---|
| Variant-1 | 3.3/2.5V | 3.3/2.5V | VDD1 (3.3/2.5V) or VDD2 (3.3/2.5V) |
| Variant-2 | 3.3V | 1.8V | VDD2 (1.8V) |
| Variant-3 | 3.3V | 1.8V | VDD1 (3.3V) |

PREVENTING REVERSE-CURRENT FLOW WHEN AN INTEGRATED CIRCUIT OPERATES USING POWER SUPPLIES OF DIFFERENT MAGNITUDES

PRIORITY CLAIM

The instant patent application is related to and claims priority from the co-pending provisional India patent application entitled, "Preventing Reverse Current Flow-Back in a Multiple Supply Voltage Pad-Ring System", Serial No.: 202141048243, Filed: 22 Oct. 2021, which is incorporated in its entirety herewith to the extent not inconsistent with the description herein.

BACKGROUND

Technical Field

Embodiments of the present disclosure relate generally to integrated circuits (IC) that use multiple power supply voltages, and more specifically to preventing reverse-current flow when an integrated circuit operates using power supplies of different magnitudes.

Related Art

Power supply refers to a component or device which generates a stable (regulated) output voltage at an output terminal from an input voltage received at an input terminal, as is well known in the relevant arts. In general, the output voltage is sought to be maintained at a fixed level irrespective of the magnitude of load current that may be drawn by a load powered by the output voltage, or of changes in the magnitude of the input voltage.

Integrated circuits (ICs) often operate using multiple power supplies of different magnitudes. For example, a portion of an IC may be powered by a power supply providing 3.3V, while another portion of the IC may be powered by another power supply providing 1.8V. Use of such different magnitudes of power supplies enables optimization of power and/or performance, as is well known in the relevant arts.

Reverse current refers to current that can flow from an IC (or from a component external to the IC but through the IC) to a power supply (used by the IC). It is generally desirable that such reverse-current flow be prevented.

BRIEF DESCRIPTION OF THE VIEWS OF DRAWINGS

Example embodiments of the present disclosure will be described with reference to the accompanying drawings briefly described below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

An integrated circuit (IC) provided according to an aspect of the present disclosure comprises input/output (I/O) ports, each operating using one of a pair of unequal power supplies during normal operation of the IC. A lower supply of the pair of unequal power supplies is required to be used as the power supply for the I/O port when a first input signal to the IC is received from an external source on a first I/O port of the I/O ports. The voltage range of the logic excursions of the first input signal is greater than the range from a magnitude of the lower supply to a constant reference potential. A regulation loop derives a derived lower supply having a magnitude equaling that of the lower supply from the higher supply of the pair of unequal power supplies, and applies the derived lower supply on a power supply node of the first I/O port.

According to an aspect, the first input signal is a reset signal received from the external source to cause a reset operation of the IC. As is well known, a reset of an IC refers to an initialization operation to bring the IC to a known base state from which the IC can start functioning. Due to the operation of the regulation loop, reverse current flow is prevented from the power supply node of the first I/O port to the regulator generating the lower supply.

Several aspects of the present disclosure are described below with reference to examples for illustration. However, one skilled in the relevant art will recognize that the disclosure can be practiced without one or more of the specific details or with other methods, components, materials and so forth. In other instances, well-known structures, materials, or operations are not shown in detail to avoid obscuring the features of the disclosure. Furthermore, the features/aspects described can be practiced in various combinations, though only some of the combinations are described herein for conciseness.

2. Example Device

Figure 1:
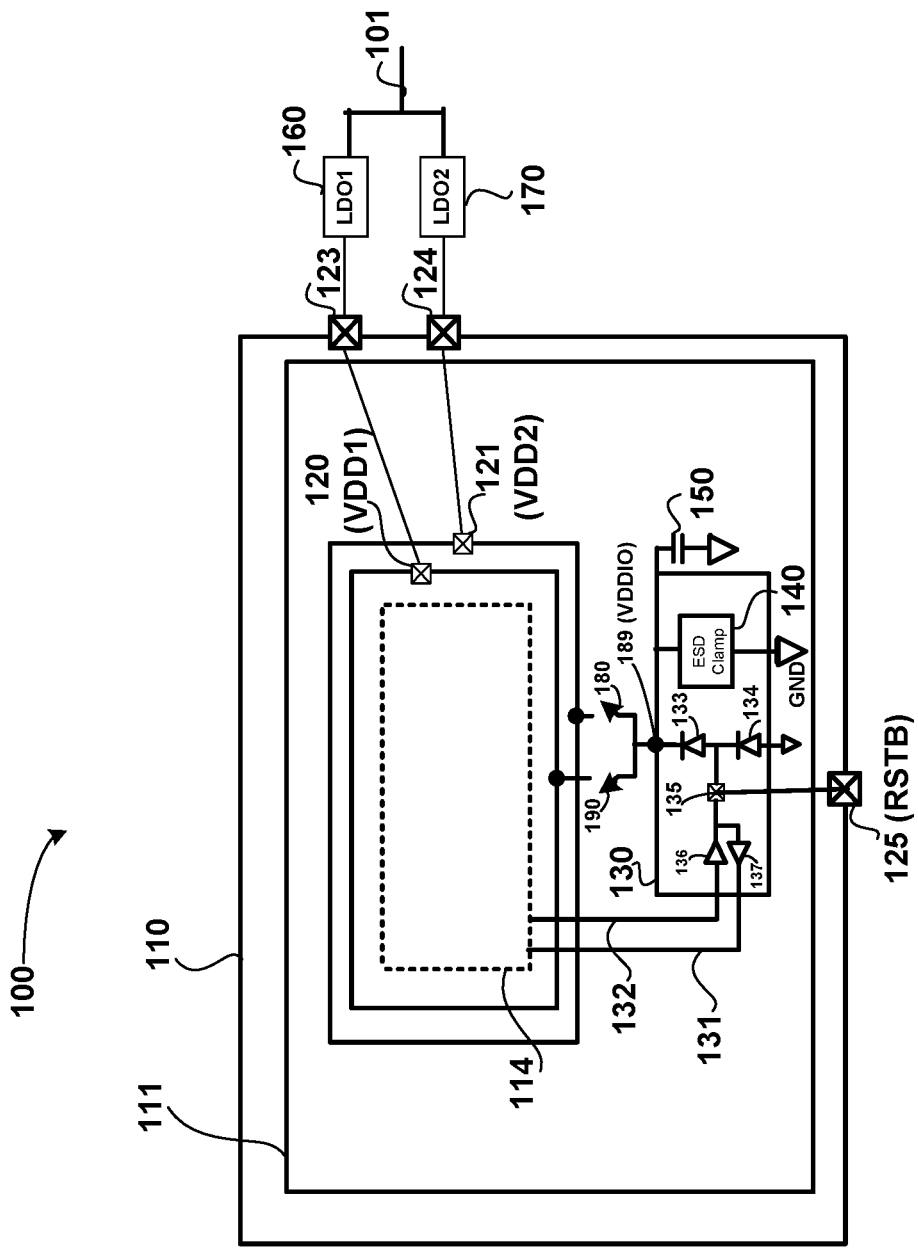
FIG. 1 is a block diagram of an example device in which several aspects of the present disclosure can be implemented.

FIG. 1 is a diagram of an example integrated circuit (IC) 100 in which several aspects of the present disclosure can be implemented. Numeral 110 represents the chip package boundary, and numeral 111 represents the chip silicon die boundary. Numeral 114 represents the core area containing electronics circuitry within the silicon die. Three pins of IC 100, namely 123, 124 and 125 are shown in FIG. 1. IC 100 is shown as using two power supplies 160 (LDO1) and 170 (LDO2) for its operation. Each of LDOs 160 and 170 represents a low-dropout regulator and receives power from a power-source connected to path 101. Other types of voltage regulators can be used in place of LDO1 and LDO2. In an embodiment, LDO1 provides 3.3V on path 123 while LDO2 generates 1.8V on path 124. Pins 123 and 124 are respectively connected to power-supply pad rings 120 and 121.

Although not shown, IC 100 would typically contain many more package pins connected to corresponding die pads. In an embodiment, lower voltage 1.8V (VDD2) is used to power the circuits that consume more power, while higher voltage 3.3V (VDD1) is used to power the rest of the circuitry except for input/output ports (I/O ports, described below), reset port and serial communication port (e.g., according to the standards I²C/SPI). However, in other embodiments, other voltage values can be used. In an embodiment of the present disclosure, IC 100 contains one or more phase-locked loops (PLL) in the core area 114. Various configuration values needed for configuration of the one or more PLLs are provided by an external device to IC 100 via the I/O ports (or specifically input ports). Some examples of the inputs to the I/O ports are reset input for resetting IC 100, register values for configuring the one or more PLLs (such as feedback divider division factor and pre-scaler values), DCO (digitally controlled oscillator of a PLL) frequency change triggers, general purpose inputs, etc. Some examples of the outputs from the I/O ports are PLL lock/loss-of-lock indications, clock outputs for monitoring by an external device, etc. Thus, the respective inputs (outputs) of the I/O ports would have connections to (from) corresponding circuitry, including the PLLs, in the core area 114. Paths 131 and 132 are examples of such connections, and are described below.

Input/output (bidirectional) port 130 of IC 100 is shown connected to package pin 125. IC 100 would typically have many more of such I/O ports (bidirectional and/or unidirectional), but are not shown in FIG. 1 for conciseness. In the example of FIG. 1, port 130 is the port (reset port) that receives a reset signal (RSTB/active low) from an external device or power-ON reset circuit/chip. Port 130 is shown as a bidirectional port, although in other embodiments it can be an input port for the reset signal. Binary outputs to be transmitted from port 130 are received on path 132 from corresponding circuit in core 114, and buffered through tri-state buffer 136 and provided on pad 135 and to package pin 125. External binary inputs (e.g., reset signal in the example of FIG. 1) to be received at port 130 from an external source and via package pin 125 and pad 135 are buffered by buffer 137 and forwarded to core 114 on path 131. Specifically, the reset signal causes IC 100 to be initialized to a known base state from which it can start operating, with all the configurable registers, connections, etc., in the circuitry in IC 100 including those in core 114 (such as PLLs) being initialized to known initial values/states. As may be well known, the reset signal is typically asserted at the time of power-ON of an IC (here IC 100) or when IC 100 is to be restarted from the known base state while being in a power-ON state. The time/duration (reset duration) for which the reset signal is to remain asserted may be dependent on the specific implementation of the circuits/blocks in IC 100. Upon completing of initialization of IC 100 to the known base state, the reset signal may be de-asserted, and IC 100 begin its normal operation. As used herein, the term 'normal operation' is used to refer to operations of IC 100 upon exit from reset operation.

An output signal from core 114 may be received at package pin 124 via pad 135 via path 132. Diodes 133 and 134 are used as protective components to prevent large voltages at pin 125 that may be above VDDIO or below ground from damaging circuitry in IC 100. ESD clamp 140 (in combination with diodes 133 and 134) is used to prevent electrostatic discharge (ESD) on pin 125 from damaging circuitry in IC 100. Capacitor 150 is a power-supply decoupling capacitor. Although not shown in the Figures, each of buffers 136 and 137 would be powered by VDDIO 189.

VDDIO (node/path 189) represents the power supply path for the multiple I/O ports including port 130. Path 189 may be connected to one of VDD1 and VDD2 after chip reset (the operation of IC 100 following reset being termed 'normal operation' herein), and the specific power supply (VDD1 or VDD2) is selected or set at power-ON (following chip reset) based, for example, on configuration information that may be stored in a one-time programmable (OTP) memory (not shown) or in general non-volatile memory (NVM) contained in IC 100 or externally provided in a user device/system. Depending on the configuration information, the corresponding one of switches 190 and 180 is closed following (at the end of) reset to connect the ports power supply (VDDIO) path 189 to the desired power supply VDD1 or VDD2.

In an embodiment of the present disclosure, IC 100 contains a digital configuration engine (not shown) which reads the configuration data from a NVM (Non-volatile memory), and performs the configuration of IC 100 including the setting of VDDIO as noted above.

Figures 2, 3:
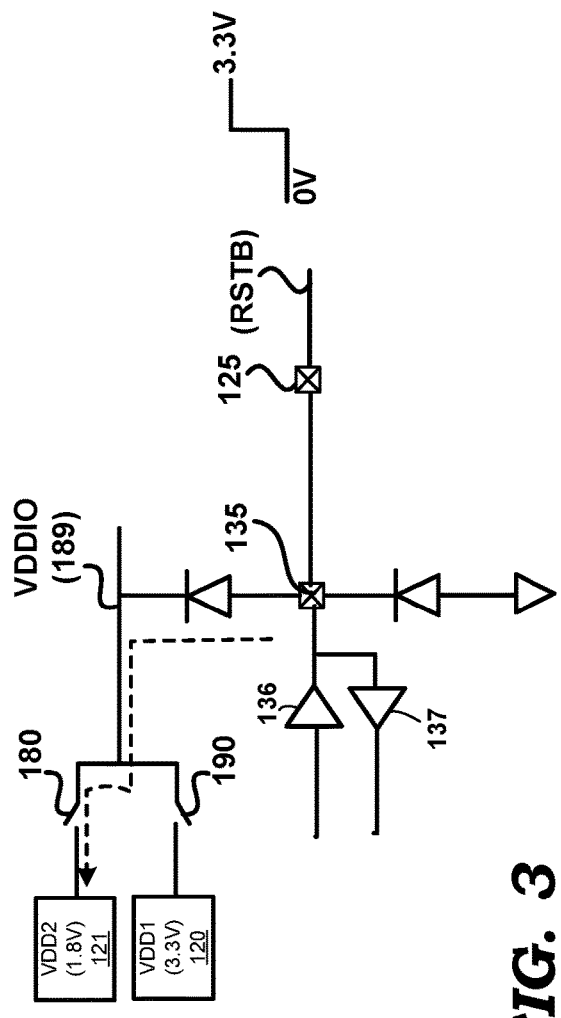
FIG. 2 is a diagram of a table used to illustrate power supply voltages for I/O ports of an IC, in an embodiment of the present disclosure.
FIG. 3 is a diagram illustrating an example of reverse-current flow in an example scenario in an embodiment of the present disclosure.

Depending on user or system-integrator requirements, several VDDIO voltage configurations can be supported by storing the configuration data in OTP/NVM memory, as noted above. FIG. 2 shows table 200 that lists representative configurations of VDDIO in an embodiment. Column 210 notes three chip variant. Columns 220, 230 and 250 respectively list the voltage values of the power supplies VDD1, VDD2 and VDDIO for each of the three variants. Supporting all the chip variants may require the design of IC 100 to address the problem of potential reverse-current flow that might occur under certain configurations.

FIG. 3 illustrates an example of reverse-current flow in an example scenario. FIG. 3 shows a portion of port 130 of FIG. 1. IC 100 is reset by external input RSTB (reset signal) applied on pin 125. In an embodiment, the reset signal RSTB is active low and is held at logic zero for a predetermined duration to cause reset of IC 100. During reset (i.e., RSTB equals logic zero), OTP/NVM having VDDIO configuration data is also under reset, and the desired/user-selected voltage (VDD2 or VDD1) is not yet applied on VDDIO path 189.

From table 200 of FIG. 2, it may be observed that to support both variant 2 and variant 3 configurations, IC 100 should be capable of being reset by logic excursions of RSTB in both of ranges 0V-1.8V as well as 0V-3.3V, depending on the externally provided RSTB signal. The worst-case scenario is when RSTB has logic excursions in the range 0V-1.8V, and VDDIO is set to 3.3V. In such a scenario, correct/reliable release from reset cannot be guaranteed since the maximum logic high level of RSTB can only be 1.8V, which port 130 and IC 100 may not correctly recognize as end of reset. Therefore, to accommodate both variants 2 and 3, IC 100 must be capable of being reliably reset in either case (i.e., RSTB excursion from 0V-1.8V as well as 0V-3.3V). Hence it is required that VDDIO be set to 1.8V (VDD2) for the reset to reliably occur. Once reset release is over, the OTP configurations can be applied and VDDIO can be set to 3.3V (variant 3) or remain at 1.8V (variant 2).

To support the worst-case scenario noted above, VDDIO needs to be set to 1.8V for the complete duration of reset (including exit/release from reset). However, setting VDDIO to 1.8V during the reset operation can result in reverse current flow into LDO2 (FIG. 1) when RSTB has logic excursions in the range 0V-3.3V. That is to say, when the voltage range of logic excursions (0V-3.3V) of the reset (RSTB) signal received from an external source on port is greater than the range from a magnitude of the lower supply (1.8V) to a constant reference potential (0V), then a reverse-current flow can occur into LDO2.

FIG. 3 illustrates such a condition. If switch 180 were to be closed to set VDDIO to VDD2 (1.8V) by default (i.e., right from the beginning of reset), then starting from the de-assertion (release) of RSTB back to logic high (3.3V), reverse-current would flow from pin 125 back into LDO2, as indicated by the dotted arrow. Such reverse-current flow may occur until VDDIO is correctly configured as VDD1 (3.3V). A reverse-current flow may also occur if any other port receives an input signal that has a voltage greater than VDD2 during the reset operation. Such reverse flow can adversely affect the reliability of regulator LDO2, and therefore needs to be prevented. Furthermore, although the problem above and the solutions below are described in the context of reset operations, such or similar problems can be expected to occur in other contexts as well (e.g., during the normal operation of IC 100), and therefore the techniques and solutions described below are also be applicable and effective in the context of such other contexts (e.g., 'normal operation' (i.e., outside of the reset operation)) of an IC or circuit in general.

The manner in which such reverse-current flow is prevented, while still supporting the requirements of variants 2 and 3, is described next with respect to an embodiment.

3. Preventing Reverse-Current Flow

Figure 4:
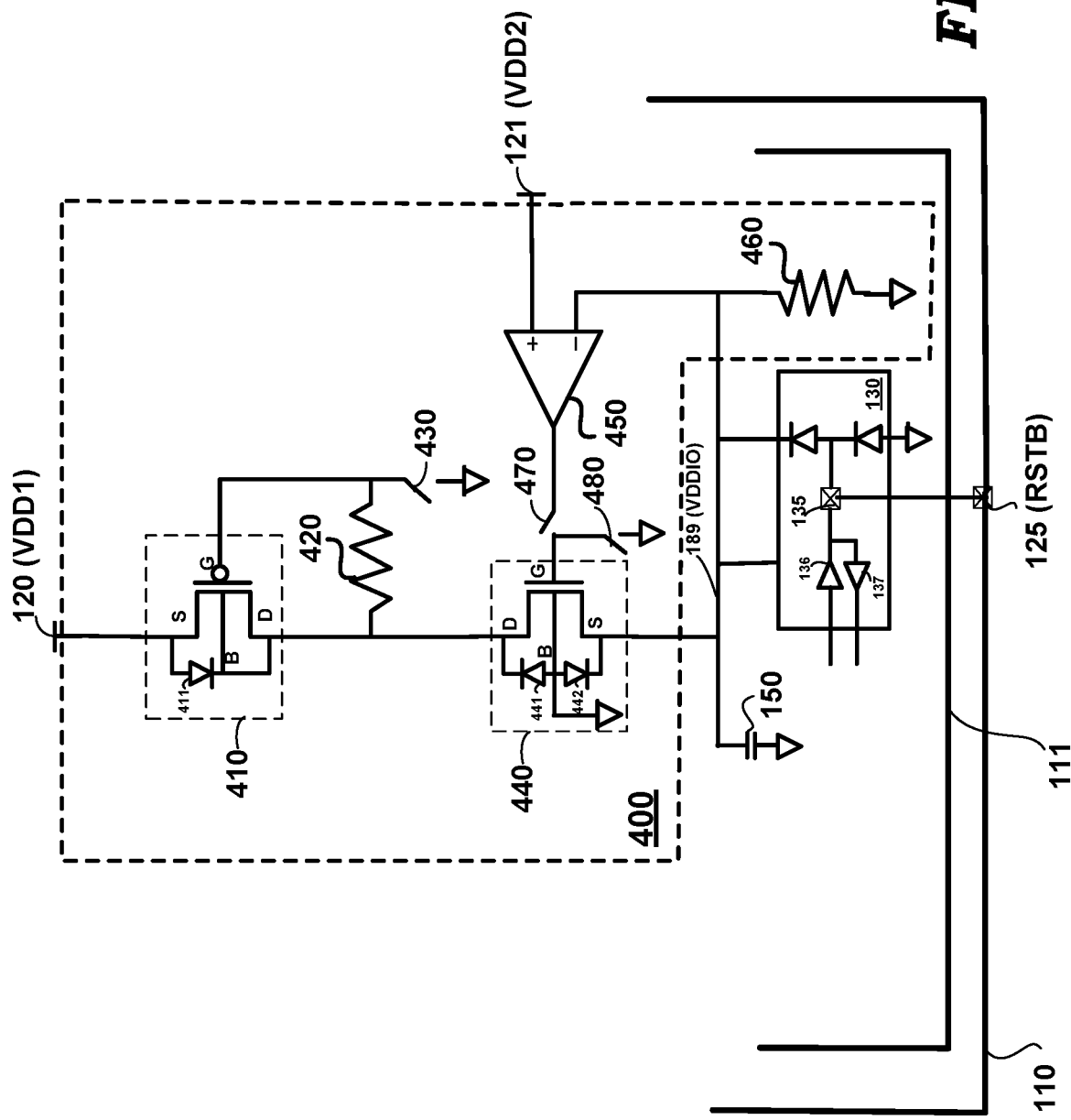
FIG. 4 is a diagram illustrating the circuit structure used to prevent reverse-current flow in an example scenario in an embodiment of the present disclosure.

FIG. 4 is a diagram illustrating the circuit structure used to prevent reverse-current flow in an embodiment of the present disclosure. Although, the description below is provided in the specific context of the problem noted above, similar or identical techniques as in the solution described below can be used in other similar contexts. Further, although the description below is provided in the context of an IC, identical or similar solutions can be applied in the context of discrete circuitry as well.

A portion of IC 100 of FIG. 1, and specifically reset port 130 (ESD clamp 140 not shown for clarity), is shown in FIG. 4. Regulation loop 400 is implemented in IC 100 and operates to prevent the reverse-current flow at the end of reset noted above. Regulation loop 400 is shown containing P-type metal oxide semiconductor (PMOS) transistor 410, resistor 420, switch 430, native N-type metal oxide semiconductor (native-NMOS) transistor 440, differential amplifier 450, resistor 460 and switches 470 and 480.

PMOS transistor 410 may be implemented as a double-gated (front gate and back gate) transistor, and its back-gate is locally connected as shown to avoid flow back through this transistor. Diodes 411, 441 and 442 represent parasitic well/diffusion diodes in the respective transistors.

Upon power-up of IC 100 and for the entire duration of reset (including end of reset), switches 430 and 470 are in closed condition (and implemented as normally closed (NC) semiconductor switches), while switch 480 is in open condition (and implemented as normally open (NO) semiconductor switch). PMOS 410 is ON (conducting). Native NMOS 440 is a native transistor. As is well known in the relevant arts, native transistors have very low threshold voltages (Vt). Native NMOS 440 has a very low (close to 0V) or even negative threshold voltage Vt. In the embodiment of FIG. 4, native NMOS 440 is designed to have a threshold voltage of around −200 mV (milli volts) to ensure that native NMOS 440 is conductive (i.e., ON condition) even when the voltages VDD1 and VDD2 are equal (for example, to support variant 1 shown in table 200 of FIG. 2). Native NMOS 440 having a lower Vt is also used with a view to provide adequate headroom to the regulator pass device (native NMOS 440 here) when lower VDD1 (120) needs to be supported. Such lower value can be, for example, 2.25V.

Differential amplifier 450 is connected to receive VDD2 (1.8V) from path 121 on one input terminal (+), with the other input terminal (−) being connected to sense the VDDIO voltage for regulation. Resistor 460 connected to ground provides the quiescent current to bias the pass device 440. Differential amplifier 450 operates to bring the voltage difference between voltages at the respective input terminals to be 0V. Therefore, differential amplifier 450 generates an output voltage (connected to gate terminal of native NMOS 440) via switch 470 so as to cause 1.8V to be developed on the input terminal connected to ground, which is the same as VDDIO power supply node 189. The 1.8V is obtained from power supply VDD1 received on path 120 (3.3V) and via PMOS 410 which is in ON condition, with the difference voltage (3.3V-1.8V) dropped across native NMOS 440 when PMOS 410 is not employed/implemented. When PMOS 410 is employed in regulation loop 400, some of the voltage difference between VDD1 and VDDIO may be dropped across PMOS 410, and would typically be a small constant value. Thus, regulation loop 400 is a linear voltage regulator loop with native NMOS 440 being the pass element. Output voltage of differential amplifier 450 controls the gate voltage of native NMOS 440 such that the voltage on node 189 is maintained at 1.8V.

Thus, regulation loop 400 operates to provide on path VDDIO a power supply voltage equal to VDD2 (1.8V) that is derived from VDD1 (3.3V). Since there is no current path from RSTB pin 125 and path 121 (on which VDD2 is received), no reverse current can flow from pin 125 to LDO2. Similarly, no reverse current can flow from any other input port to LDO2.

Regulation loop 400 is operational during reset of IC 100 and until the reset is released and additionally until configuration is complete, with the desired one of switches 180 and 190 closed to apply the corresponding voltage (VDD1 or VDD2) to VDDIO. In addition, if configuration data is to be updated or to be received upon release from reset following power-UP of IC 100, then regulation loop 400 is operational until such updating or receipt is complete and the new configuration data has been applied to configure IC 100 (including supply voltage for VDDIO).

In an embodiment of the present disclosure, a non-volatile memory (NVM) is used to store configuration data (which includes data indicating which of VDD1 and VDD2 is to be used as VDDIO). When/if the NVM is to be updated upon end of power-ON reset (reset following power-ON) of IC 100, a digital configuration engine (not shown, but as noted above) receives the updates and write the updates to the configuration data in the NVM. Upon completion of writing to the NVM, the digital configuration engine performs the configuration of IC 100 (including setting of VDDIO), and upon completing the configuration causes regulation loop 400 to become non-operational as described next.

In the embodiment shown in FIG. 4, upon completing configuration of IC 100, the digital configuration block (noted above) opens switches 430 and 470, and closes switch 480, at or after the completion of configuration of IC 100 to render regulation loop 400 non-operational thereafter (since PMOS 410 and native NMOS 440 are each OFF (non-conducting)). Thus, regulation loop 400 becomes non-operational, and the voltage on path 189 (VDDIO) is determined by the configuration data (noted above) based on which one of switches 180 and 190 (FIG. 1) is closed to apply the corresponding voltage on VDDIO 189.

PMOS transistor 410 is used in regulation loop 400 to prevent any potential reverse-current flow back into VDD1 (120) from input ports such as reset port 130, or path 189 in general, due to the possibility of native NMOS 440 being ON even with its gate terminal held at 0V (switch 480 is closed) after configuration of IC 100 is complete. Such reverse-current flow could otherwise occur due to improper sequencing of VDD1 and I/O port inputs. An example is when one or more I/O port inputs are asserted to 3.3V before VDD1 LDO (160) is powered up and VDD1 is stable at the desired level (3.3V in the example herein).

Although regulation loop 400 is described above as being implemented as a linear voltage regulator, in alternative embodiments regulation loop 400 can be implemented as other types of voltage regulators such as switching regulators.

The manner in which reverse-current flow is prevented in other scenarios is described briefly next with examples.

4. Other Examples of Reverse-Current Flow

Figure 5:
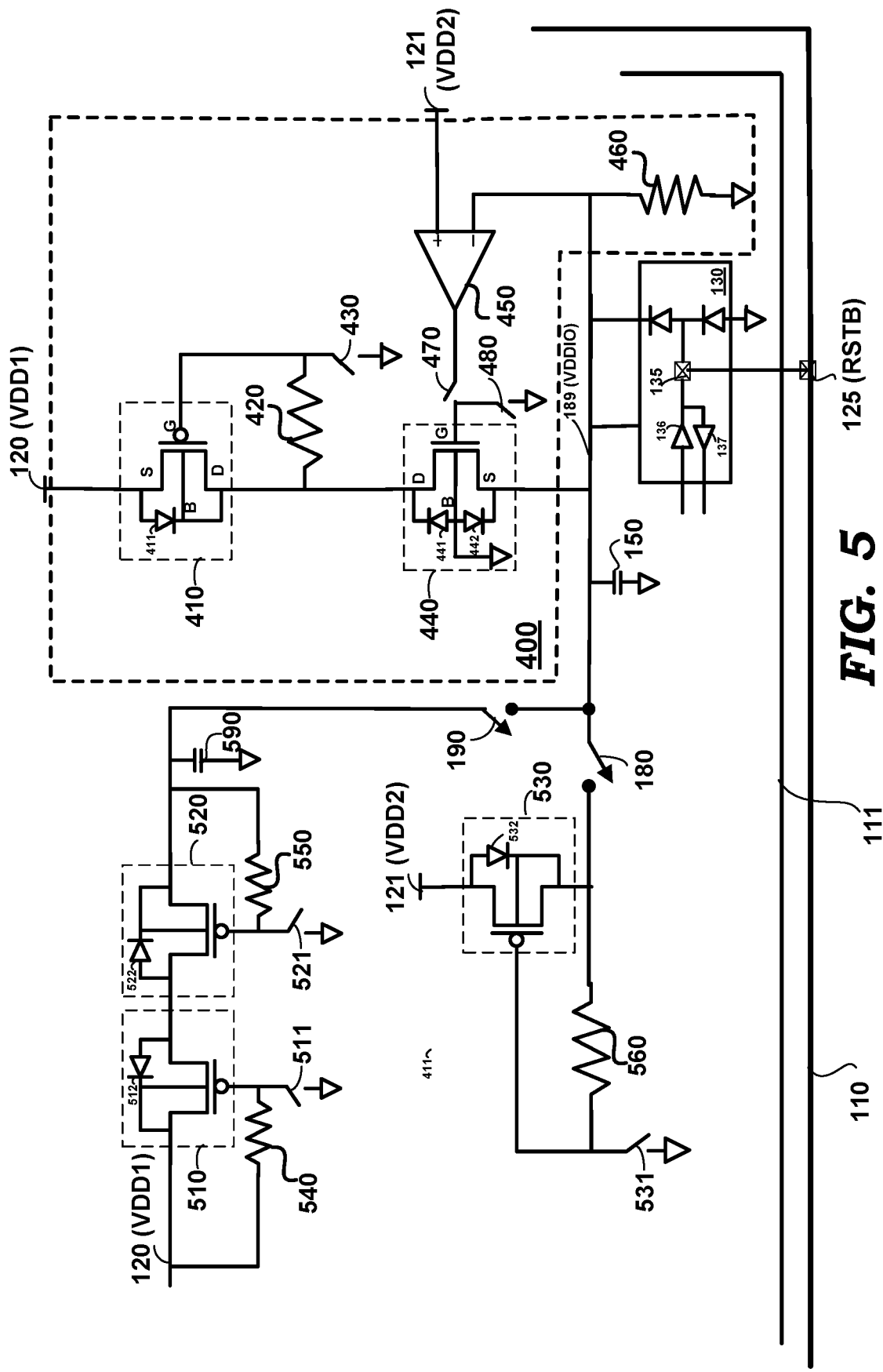
FIG. 5 is a diagram illustrating additional circuit structures used to prevent reverse-current flow in other example scenarios in an embodiment of the present disclosure.

FIG. 5 is a diagram used to illustrate the manner in which reverse-current flow is prevented according to other examples. In addition to the circuits shown in FIG. 4 (which are not described again), FIG. 5 additionally shows PMOS transistors 510, 520 and 530, resistors 540, 550 and 560, normally-open (NC) switches 511, 521 and 531, power-supply de-coupling capacitor 590. Switches 180 and 190 of FIG. 1 are also shown. Diodes 512, 522 and 532 represent parasitic well-diodes of the respective transistors. PMOS transistors 510, 520 and 530 may each be implemented with their back-gates connected as shown to avoid flow back current path under different operating scenarios. The use of the additional circuitry is briefly described next.

The back-gates of PMOS 510 and 520 are respectively connected to VDD1 and VDDIO. The back-gate of PMOS 530 is connected to VDDIO. The respective resistors 540, 550, 560 are used to ensure that the corresponding PMOS transistors are OFF when the supplies VDD1 and VDD2 are not present (i.e., IC 100 is not powered-ON) by ensuring that the source-to-gate voltages "Vsg" of each PMOS is 0V.

PMOS 510 and 520 prevent reverse-current flow into LDO1 160 (which generates VDD1, and is shown in FIG. 1) from path 189 (VDDIO) when IC 100 is not powered-ON, i.e., is OFF, with LDO1 (160) non-operational. Under such condition, if PMOS 510 and 520 were not employed, an input signal on an I/O port (e.g., 130) could cause reverse current flow into LDO1. When IC 100 is OFF due to LDO1 being non-operational, switches 511 and 521 are open, and hence each of PMOS 510 and 520 is OFF, thereby preventing potential reverse-current flow from VDDIO path into LDO1.

PMOS 510 and 520 (specifically PMOS 520) also prevent reverse-current flow into VDD1 path from LDO2 (which generates VDD2) in the event of LDO1 powering-up later than LDO2 at power-ON of IC 100. PMOS 530 prevents reverse-current flow into VDD2 path from VDDIO path.

Although not described in full detail, it may be verified that the additional use of PMOS 510, 520 and 530 and the respective resistors and connections, along with regulation loop 400, prevents reverse-current flow back into either of LDO1/VDD1 or LDO2/VDD2 for all combinations of power-up and/or power-down sequencing of supply voltages VDD1, VDD2 and VDDIO as well as I/P port input signal sequencing in the system.

IC 100 implemented as described above can be incorporated in a larger device or system as described briefly next with an example.

5. System

Figure 6:
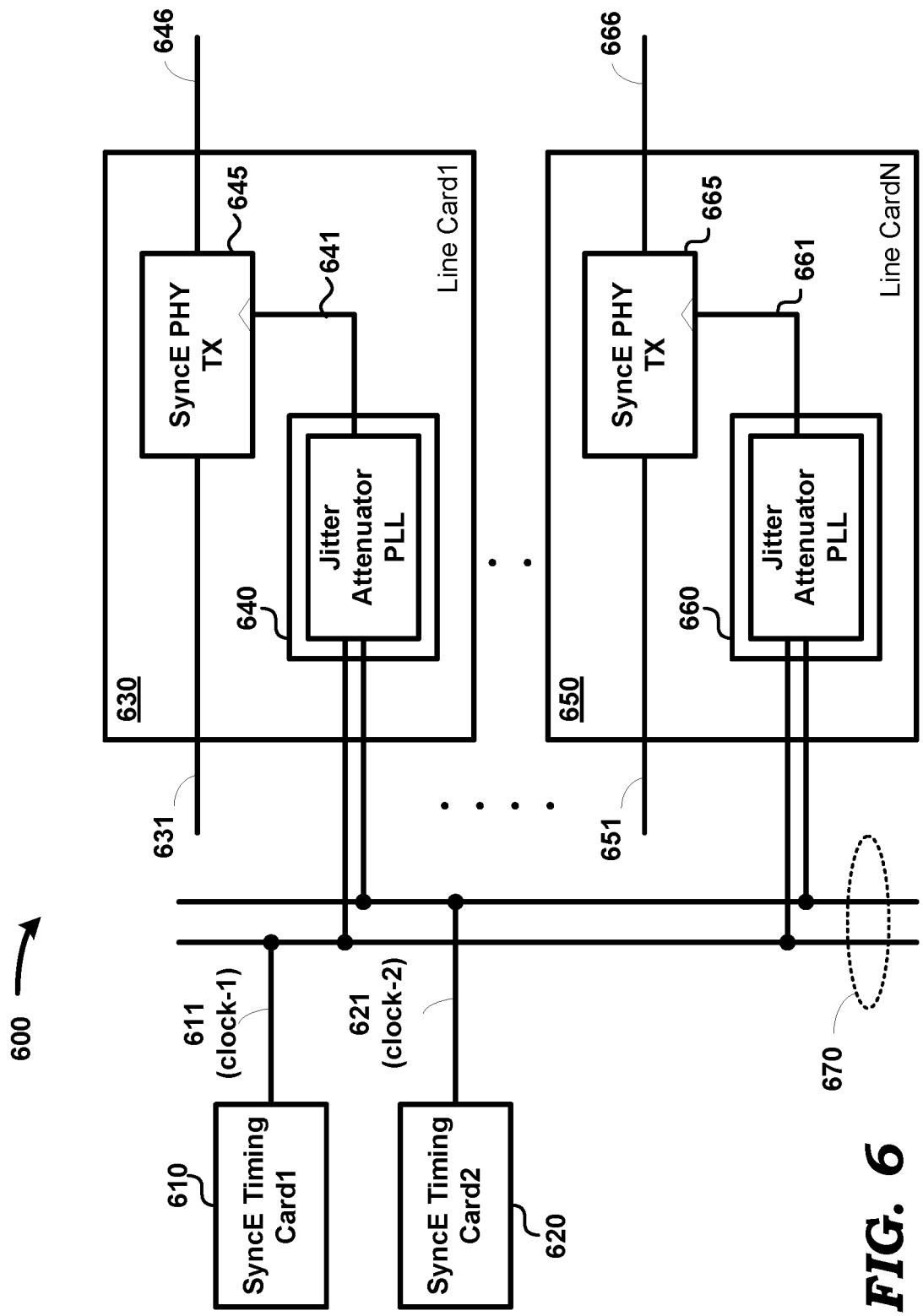
FIG. 6 is a block diagram illustrating the implementation details of a system incorporating an IC implemented according to several aspects of the present disclosure.

FIG. 6 is a block diagram illustrating the implementation details of a system incorporating IC 100 as described in detail above. System 600 is shown containing SyncE (Synchronous Ethernet) timing cards (610 and 620) and line cards 1 through N, of which only two line cards 630 and 650 are shown for simplicity. Line card 630 is shown containing jitter attenuator PLL 640 and SyncE PHY Transmitter 645. Line card 650 is shown containing jitter attenuator PLL 660 and SyncE PHY Transmitter 665. The components of FIG. 6 may operate consistent with the Synchronous Ethernet (SyncE) network standard. As is well known in the relevant arts, SyncE is a physical layer (PHY)-based technology for achieving synchronization in packet-based Ethernet networks. The SyncE clock signal transmitted over the physical layer should be traceable to an external master clock (for example, from a timing card such as card 610 or 620). Accordingly, Ethernet packets are re-timed with respect to the master clock, and then transmitted in the physical layer. Thus, data packets (e.g., on path 631 and 651) are re-timed and transmitted without any time stamp information being recorded in the data packet. The packets may be generated by corresponding applications such as IPTV (Internet Protocol Television), VoIP (Voice over Internet Protocol), etc.

Thus, line card 630 receives a packet on path 631, and forwards the packet on output 646 after the packet has been re-timed (synchronized) with a master clock. Similarly, line card 650 receives a packet on path 651, and forwards the packet on output 666 after the packet has been re-timed (synchronized) with a master clock.

The master clock (611/clock 1) is generated by timing card 610. Timing card 620 generates a redundant clock (621/clock-2) that is to be used by line cards 630 and 650 upon failure of master clock 611. Master clock 611 and redundant clock 621 are provided via a backplane (represented by numeral 670) to each of lines cards 630 and 650.

In line card 630, jitter attenuator PLL 640 may be implemented as IC 100 described above in detail, and receives clocks 611 and 621. Alternatively, line card 630 may be implemented to contain jitter attenuator PLL 640 as a separate block, with the I/O ports and reverse-current prevention circuitry described above implemented separately using discrete components/circuitry. PLL 640 generates an output clock 641 which is used to synchronize (re-time) packets received on path 631 and forwarded as re-timed packets on path 646.

Similarly, in line card 650, jitter attenuator PLL 660 may also be implemented as IC 600 described above in detail, and receives clocks 611 and 621. Alternatively, line card 650 may be implemented to contain jitter attenuator PLL 660 as a separate block, with the I/O ports and reverse-current prevention circuitry described above implemented separately using discrete components/circuitry. PLL 660 generates an output clock 661 which is used to synchronize (re-time) packets received on path 651 and forwarded as re-timed packets on path 666.

Similar to IC 100 described above, each of line cards 630 and 650 too has a reset operation (when being reset to initialize all the circuits, including PLL, I/O ports, etc., on the corresponding line card) and a normal operation post the reset operation. In an embodiment, one or more configuration data to configure the corresponding PLL for a desired operation are received at configuration registers in the corresponding line card via one or more of the I/O ports. The configuration registers may be implemented either within the corresponding PLL or outside the PLL as separate circuitry or IC on the line card.

Implementation of the jitter attenuator PLLs 640 and 650 as IC 100, or alternatively implementation of line cards 630 and 650 with PLL, I/O circuitry and reverse-current protection circuitry as separate blocks and in discrete form ensures no reverse currents can flow into the corresponding power supplies (not shown in FIG. 6).

6. Conclusion

References throughout this specification to "one embodiment", "an embodiment", or similar language means that a particular feature, structure, or characteristic described in connection with the embodiment is included in at least one embodiment of the present disclosure. Thus, appearances of the phrases "in one embodiment", "in an embodiment" and similar language throughout this specification may, but do not necessarily, all refer to the same embodiment.

While in the illustrations of FIGS. 1, 3, 4, 5 and 6 although terminals/nodes are shown with direct connections to (i.e., "connected to") various other terminals, it should be appreciated that additional components (as suited for the specific environment) may also be present in the path, and accordingly the connections may be viewed as being "electrically coupled" to the same connected terminals.

It should be appreciated that the specific type of transistors (such as NMOS, PMOS, etc.) noted above are merely by way of illustration. However, alternative embodiments using different configurations and transistors will be apparent to one skilled in the relevant arts by reading the disclosure provided herein. For example, the NMOS transistors may be replaced with PMOS (P-type MOS) transistors, while also interchanging the connections to power and ground terminals.

Accordingly, in the instant application, the power and ground terminals are referred to as constant reference potentials, the source (emitter) and drain (collector) terminals of transistors (though which a current path is provided when turned on and an open path is provided when turned off) are termed as current terminals, and the gate (base) terminal is termed as a control terminal.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. An integrated circuit (IC) comprising:
   one or more input/output (I/O) ports, each of the one or more I/O ports to operate using one of a pair of unequal power supplies during normal operation of the IC, wherein a first input signal is received from an external source on a first I/O port comprised in the one or more I/O ports,
   wherein a lower supply of the pair of unequal power supplies is required to be used as the power supply for the first I/O port, wherein the voltage range of logic excursions of the first input signal is greater than the range from a magnitude of the lower supply to a constant reference potential; and
   a regulation loop to derive a derived lower supply having a magnitude equaling that of the lower supply from the higher supply of the pair of unequal power supplies, and to apply the derived lower supply on a power supply node of the first I/O port.

2. The IC of claim 1, wherein the first input signal is a reset signal received from the external source to cause a reset operation of the IC and wherein the constant reference potential is zero volts.

3. The IC of claim 2, wherein the regulation loop is designed to provide the derived lower supply on the power supply node of the first I/O port until a desired one of the pair of unequal power supplies has been applied to the power supply node of the first I/O port for normal operations of the IC.

4. The IC of claim 3, wherein the lower supply of the pair of unequal power supplies is required to be used as the power supply for the I/O port during said reset operation of the IC to ensure reset of the IC when the external source generates the reset signal with logic excursions between a first constant reference potential and the magnitude of the lower supply.

5. The IC of claim 3, wherein the IC is coupled to the lower supply via a first supply path and the higher supply via a second supply path, wherein the regulation loop is a linear voltage regulator comprising:
   a differential amplifier comprising a first input terminal and a second input terminal, the first input terminal coupled to the first supply path, the second input terminal coupled to sense an output voltage of the regulation loop, the differential amplifier to generate a signal representing a difference between respective voltages on the first input terminal and the second input terminal on an output terminal of the differential amplifier; and
   a pass element coupled between the second supply path and the power supply node of the first I/O port, wherein an impedance of the pass element is determined by a magnitude of the difference.

6. The IC of claim 5, wherein the pass element is an N-type metal oxide semiconductor (NMOS) transistor, wherein a first current terminal of the NMOS transistor is coupled to the second supply path, wherein a second current terminal of the NMOS transistor is coupled to the power supply node of the first I/O port, and wherein a control terminal of the NMOS transistor is coupled to the output terminal of the differential amplifier.

7. The IC of claim 6, wherein the NMOS transistor is a native NMOS transistor, the IC further comprising a first P-type metal oxide semiconductor (PMOS) transistor coupled between the native NMOS transistor and the second supply path.

8. The IC of claim 7, further comprising:
   a first resistor coupled between the second input terminal of the differential amplifier and the first constant reference potential;
   a first switch operable to be closed to couple the output terminal of the differential amplifier to the control terminal of the native NMOS transistor until the desired one of the pair of unequal power supplies has been applied to the power supply node for normal operations of the IC, the first switch to be open thereafter; and
   a second switch operable to be closed to couple the control terminal of the native NMOS transistor to the first constant reference potential after the desired one of the pair of unequal power supplies has been applied to the power supply node for normal operations of the IC, the second switch to be open otherwise.

9. The IC of claim 8, wherein a first current terminal of the first PMOS transistor is coupled to the second supply path, wherein a second current terminal of the first PMOS transistor is coupled to the first current terminal of the native NMOS transistor, and
wherein a control terminal of the first PMOS transistor is coupled to the second current terminal of the first PMOS transistor via a second resistor, the IC further comprising:
a third switch operable to be closed to couple the control terminal of the first PMOS transistor to the first constant reference potential until the desired one of the pair of unequal power supplies has been applied to the power supply node for normal operations of the IC, the third switch to be open thereafter.

10. The IC of claim 9, further comprising:
a second PMOS transistor, a third PMOS transistor and a fourth PMOS transistor,
wherein a series combination of the second PMOS transistor and the third CMOS transistor is coupled between the second supply path and the power supply node of the first I/O port, each of the second PMOS transistor and the third PMOS transistor operable to be OFF when the higher supply is not available on the second supply path, thereby preventing reverse-current flow from the power supply node of the first I/O port to the second supply path, each of the second PMOS transistor and the third PMOS transistor operable to be ON when the higher supply is available on the second supply path,
wherein the fourth PMOS transistor is coupled between the first supply path and the power supply node of the first I/O port, the fourth PMOS transistor operable to be OFF when the lower supply is not available on the first supply path, thereby preventing reverse-current flow from the power supply node of the first I/O port to the first supply path, the second PMOS transistor operable to be ON when the lower supply is available on the first supply path.

11. A system comprising:
a first timing card to generate a first clock; and
a line card coupled to receive a data packet, the line card to re-time the data packet, and to transmit a re-timed packet, wherein the line card comprises:
a phase-locked loop (PLL) coupled to receive the first clock, the PLL to generate an output clock based on the first clock, wherein said line card retimes said data packet with respect to said output clock;
one or more input/output (I/O) ports, each of the one or more I/O ports to operate using one of a pair of unequal power supplies during normal operation of the line card, wherein a first input signal is received from an external source on a first I/O port comprised in the one or more I/O ports, wherein a lower supply of the pair of unequal power supplies is required to be used as the power supply for the first I/O port, wherein the voltage range of logic excursions of the first input signal is greater than the range from a magnitude of the lower supply to a constant reference potential; and
a regulation loop to derive a derived lower supply having a magnitude equaling that of the lower supply from the higher supply of the pair of unequal power supplies, and to apply the derived lower supply on a power supply node of the first I/O port.

12. The system of claim 11, wherein the first input signal is a reset signal received from the external source to cause a reset operation of the line card and wherein the constant reference potential is zero volts.

13. The system of claim 12, wherein the regulation loop is designed to provide the derived lower supply on the power supply node of the first I/O port until a desired one of the pair of unequal power supplies has been applied to the power supply node of the first I/O port for normal operations of the IC.

14. The system of claim 13, wherein the lower supply of the pair of unequal power supplies is required to be used as the power supply for the I/O port during a reset operation of the line card to ensure reset of the line card, when the external source generates the reset signal with logic excursions between a first constant reference potential and the magnitude of the lower supply,
wherein at least one configuration data to configure the PLL is received on a corresponding one of said one or more I/O ports.

15. The system of claim 13, wherein the line card is coupled to the lower supply via a first supply path and the higher supply via a second supply path,
wherein the regulation loop is a linear voltage regulator comprising:
a differential amplifier comprising a first input terminal and a second input terminal, the first input terminal coupled to the first supply path, the second input terminal coupled to sense an output voltage of the regulation loop, the differential amplifier to generate a signal representing a difference between respective voltages on the first input terminal and the second input terminal on an output terminal of the differential amplifier; and
a pass element coupled between the second supply path and the power supply node of the first I/O port, wherein an impedance of the pass element is determined by a magnitude of the difference.

16. The system of claim 15, wherein the pass element is an N-type metal oxide semiconductor (NMOS) transistor,
wherein a first current terminal of the NMOS transistor is coupled to the second supply path, wherein a second current terminal of the NMOS transistor is coupled to the power supply node of the first I/O port, and wherein a control terminal of the NMOS transistor is coupled to the output terminal of the differential amplifier.

17. The system of claim 16, wherein the NMOS transistor is a native NMOS transistor, the line card further comprising a first P-type metal oxide semiconductor (PMOS) transistor coupled between the native NMOS transistor and the second supply path.

18. The system of claim 17, further comprising:
a first resistor coupled between the second input terminal of the differential amplifier and the first constant reference potential;
a first switch operable to be closed to couple the output terminal of the differential amplifier to the control terminal of the native NMOS transistor until the desired one of the pair of unequal power supplies has been applied to the power supply node for normal operations of the IC, the first switch to be open thereafter; and
a second switch operable to be closed to couple the control terminal of the native NMOS transistor to the first constant reference potential after the desired one of the pair of unequal power supplies has been applied to the power supply node for normal operations of the IC, the second switch to be open otherwise.

19. The system of claim 18, wherein a first current terminal of the first PMOS transistor is coupled to the second supply path, wherein a second current terminal of the first PMOS transistor is coupled to the first current terminal of the native NMOS transistor, and wherein a control terminal of the first PMOS transistor is coupled to the second current terminal of the first PMOS transistor via a second resistor, the IC further comprising:

a third switch operable to be closed to couple the control terminal of the first PMOS transistor to the first constant reference potential until the desired one of the pair of unequal power supplies has been applied to the power supply node for normal operations of the IC, the third switch to be open thereafter.

20. The system of claim 19, further comprising:

a second PMOS transistor, a third PMOS transistor and a fourth PMOS transistor, wherein a series combination of the second PMOS transistor and the third CMOS transistor is coupled between the second supply path and the power supply node of the first I/O port, each of the second PMOS transistor and the third PMOS transistor operable to be OFF when the higher supply is not available on the second supply path, thereby preventing reverse-current flow from the power supply node of the first I/O port to the second supply path, each of the second PMOS transistor and the third PMOS transistor operable to be ON when the higher supply is available on the second supply path, wherein the fourth PMOS transistor is coupled between the first supply path and the power supply node of the first I/O port, the fourth PMOS transistor operable to be OFF when the lower supply is not available on the first supply path, thereby preventing reverse-current flow from the power supply node of the first I/O port to the first supply path, the second PMOS transistor operable to be ON when the lower supply is available on the first supply path.

* * * * *